(12) United States Patent
Schwab

(10) Patent No.: US 8,816,335 B2
(45) Date of Patent: Aug. 26, 2014

(54) METHOD FOR CREATING SERIALLY-CONNECTED OLED DEVICES

(75) Inventor: Holger Schwab, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/515,866

(22) PCT Filed: Dec. 8, 2010

(86) PCT No.: PCT/IB2010/055665
§ 371 (c)(1),
(2), (4) Date: Jun. 14, 2012

(87) PCT Pub. No.: WO2011/073856
PCT Pub. Date: Jun. 23, 2011

(65) Prior Publication Data
US 2012/0248472 A1    Oct. 4, 2012

(30) Foreign Application Priority Data

Dec. 16, 2009  (EP) .................................... 09179513
Jan. 8, 2010   (EP) .................................... 10150297

(51) Int. Cl.
*H01L 35/24*    (2006.01)
(52) U.S. Cl.
USPC ...................... 257/40; 438/99; 257/E51.002
(58) Field of Classification Search
USPC ......... 257/40, 642, E51.022, 759; 438/82, 99
See application file for complete search history.

(56) References Cited

U.S. PATENT DOCUMENTS

| | | | |
|---|---|---|---|
| 6,693,296 B1 | 2/2004 | Tyan | |
| 7,149,757 B2 | 12/2006 | Nishimura | |
| 7,510,885 B2 * | 3/2009 | Halls et al. | 438/22 |
| 7,709,050 B2 * | 5/2010 | Nelson et al. | 427/66 |
| 2004/0032220 A1 | 2/2004 | Cok et al. | |
| 2006/0152833 A1 | 7/2006 | Halls et al. | |
| 2009/0189515 A1 | 7/2009 | Halls et al. | |

FOREIGN PATENT DOCUMENTS

WO    2010100584 A2    9/2010

\* cited by examiner

*Primary Examiner* — Quoc Hoang
(74) *Attorney, Agent, or Firm* — Yuliya Mathis

(57) ABSTRACT

By the invention it is proposed a method of preparing a serial connection of OLED-devices, comprising the steps of providing a carrier substrate; depositing a first electrode material layer on said carrier substrate; depositing a layer of an organic optoelectronic active material on said first electrode material layer; depositing a second electrode material layer on said organic optoelectronic active material layer; ablating at least the second electrode material layer and the organic optoelectronic active material layer at least in selected areas to build a trench forming separated OLED-devices on the carrier surface; electrically interconnecting neighboring OLED-devices by connecting the anode of a first OLED-device to the cathode of a neighboring second OLED-device, wherein in the steps of depositing the organic optoelectronic active material layer and the cathode layer, the carrier substrate surface is covered over its entire functional area with said layers, and wherein the electrical interconnection of the neighboring OLED-devices is performed by at least partially filling the trenches built in the ablating step with an electrical conductive material. Furthermore, an illuminant is provided comprising serial connected OLED-devices.

6 Claims, 2 Drawing Sheets

METHOD FOR CREATING SERIALLY-CONNECTED OLED DEVICES

FIELD OF THE INVENTION

The invention relates to the field of manufacturing serial connected OLED-devices (organic light emitting diode). In one aspect, the invention relates to a method for preparing serial connected OLED-devices in which method the structuring process of forming and interconnecting OLED-devices on a carrier substrate surface is improved. In a further aspect, the invention relates to an illuminant comprising serial connected OLED-devices.

BACKGROUND OF THE INVENTION

OLED-devices are known from the state of the art. In general, an OLED-device consists at least of a first electrode material arranged on a carrier substrate, an organic optoelectronic active material deposited on the first electrode material, and a second electrode material covering at least partially the organic optoelectronic active material. One of the electrode materials acts as cathode layer, while the other electrode material acts as anode layer. As optoelectronic active material electroluminescenting materials, such as light emitting polymers, like e.g. poly(p-phenylenevinylene) (PPV), or light emitting low molecular weight materials, like e.g. aluminum tris (8-hydroxyquinoline).

As carrier substrate insulating materials, like e.g. glass or plastic can be used. As electrode material compounds like e.g. transparent conductive oxides (TCO), or metals, like e.g. copper, silver, gold, or aluminum can be used. It is also known from the state of the art to place a so called hole transporting layer between the electrode materials and the opto-electronic active material, like e.g. a PEDOT/PSS-layer (poly(3,4-ethylenedioxythiopene/polystyrolsulfonate) or a PANI/PSS-layer (polyaniline/polystyrolsulfonate), which lowering the injection barrier of the holes.

In operation, electricity is applied between the first electrode material layer and the second electrode material layer. The applied electricity causes an exited state of the optoelectronic active material by which relaxation to the non-exited state a photon is emitted. OLED-devices can be used, e.g. for displays or lighting.

To form large area OLED devices serial connected architectures are being used. To do so, it is known from the state of the art to manufacture interconnected OLED-devices by a process as described in the following.

As a first step, a substrate is manufactured in a patterning step. In this patterning step, a first electrode material is applied in pattern on a carrier substrate. The main function of this patterning step is to create electrically separated areas where later on the cathode and the anode will be electrically connected. This patterning can be done by e.g. depositing a functional layer by e.g. printing or sputtering through a shadow mask, etc.

In a subsequent step an OLED functional layer formed by an optoelectronic active material is applied. Small molecule functional layers are deposited by thermal evaporation in vacuum. The deposition of the organic material must be restricted in such a way that at least the cathode contacts are not coated. Usually, also the anode contacts are protected from the coating in order to achieve good electrical contacting later on. This structured deposition is achieved by means of a shadow mask. This mask is specific for each OLED design and is placed on top of the substrate during organic layer deposition. Masking can either be done in physical contact or with a small gap between the substrate and the mask. During the deposition process the shadow mask will be coated with the organic material.

In a next step a counter electrode is formed by deposition of a second electrode material layer. This is also applied in a vacuum thermal evaporation process. Also in this step the layer must be structured as otherwise a short circuit between the two electrode material layers, i.e. the cathode and the anode will occur. Also in this step the mask will be coated with material, wherein the cathode material typically is a metal like copper, silver, aluminum, gold, etc.

As the coated areas for organics and cathode are different a different set of masks must be used in every of the mentioned process steps.

If a serial connection of individual OLED-devices needs to be realized a very complicated set of shadow masks is required as the anode of a first OLED-device, e.g. a pixel, needs to be connected with the cathode of the next OLED-device. The minimum separation of individual OLED-devices is then determined by the alignment accuracy of the mask processes and the thermal expansion of the mask and the substrate during organics and cathode deposition. Therefore, the technique known from the state of the art has several drawbacks. As the masks are design specific a design change requires a new set of masks. This limits the throughput time for a design change and increases costs. The masks are coated during deposition. This requires regular cleaning and induces additional costs. Particles lost from the masks can lead to short circuits and reduce the yield of the production. The minimum feature size that can be realized is limited due to the thermal expansion of the masks and the alignment accuracy. This scales with the substrate size and is typically >200 µm. At least, the mask handling in vacuum is very expensive.

SUMMARY OF THE INVENTION

It is an object of the invention to provide an improved method for the manufacturing of OLED-devices.

This object is achieved by a method of preparing a serial connection of OLED devices, comprising the steps:
  providing a carrier substrate;
  depositing a first electrode material layer on said carrier substrate;
  depositing a layer of an organic optoelectronic active material on said first electrode material layer;
  depositing a second electrode material layer on said organic optoelectronic active material layer;
  ablating at least the second electrode material layer and the organic optoelectronic active material layer at least in selected areas to build a trench forming separated OLED-devices on the carrier surface;
  electrically interconnecting neighboring OLED-devices by connecting the anode of a first OLED-device to the cathode of a neighboring second OLED device,
wherein in the steps of depositing the organic optoelectronic active material layer and the cathode layer, the carrier substrate surface is covered over its entire functional area with said layers, and wherein the electrical interconnection of the neighboring OLED-devices is performed by at least partially filling the trenches built in the ablating step with an electrical conductive material.

Functional area in the meaning of the invention should be understood as the area of the carrier substrate surface on which the light emitting structure is formed. According to the invention, other areas of the carrier substrate surface, e.g. the rim area used for fixation of the OLED-device, can be left uncover, e.g. by restricting the deposition of electrode material and the optoelectronic active material to the functional area only or by masking the respective areas.

It is the inventive idea to apply the different layers needed to form an OLED-device at the most over the whole area of the substrate and to form at least most of the needed pattern by ablating specific layers in specific areas. This avoids the need of fine pattern aligning which improves the productivity of the OLED-production. Furthermore, ablating methods, like e.g. laser ablation or the like are more precise which allows to form smaller pattern. A benefit of the inventive method is that the ablation step does not need to be performed in a vacuum chamber. This makes the overall production easier to handle and omits the need for large vacuum production chambers.

According to an embodiment of the invention, in the ablating step at least the second electrode material layer, the organic optoelectronic active material layer and the first electrode material layer are ablated at least partially to build a trench forming separated OLED-devices. Ablating all of these layers further improves the method since the different layers can be deposited over the full substrate area without the need the cover or mask specific areas. The needed separation of the OLED-devices results from ablating the deposited layers down to the carrier substrate. Ablation can be performed e.g. by laser ablation, thermal ablation, plasma etching, mechanical removal, etc. A benefit of using e.g. laser ablation or plasma etching is that very small pattern can be formed, which results in a higher resolution of the overall OLED-device. Therefore, also pattern sizes <200 μm can be realized.

In a further embodiment according to the invention, the first electrode material layer is deposited in pattern on the carrier substrate, which pattern form the basic structure of the OLED-device. Basic structure in the meaning of the invention should be understood as the structure and/or size of the first electrode material layer deposited on the carrier substrate.

In a further embodiment according to the invention, the electrically conductive material interconnecting the separated OLED-devices is annealed after being placed in a trench. Annealing in the meaning of the invention may be a thermal or UV-induced annealing and/or curing process. The annealing may be induced e.g. by applying heat to the whole structure, local heating of the trench areas only, exposure of the whole structure to an UV-source, local UV-exposure at the trench area only, or any other capable method to anneal the interconnecting material alone or in combination. Local thermal and/or UV-exposure may be applied by the use of a laser having an adequate wave length.

In an embodiment of the invention, one laser system is used for the ablation as well as the annealing. In such an embodiment, the laser system may comprise different laser sources and/or a laser source having an adjustable output and/or wavelength.

According to the inventive method, the electrically conductive material interconnecting the separated OLED-devices may be a metal paste, a conductive polymer, conductive glue, or a metal layer applied by an electrochemical method, such as galvanic or autocatalytic deposition. Alternatively, the electrical connection between the separated OLED-devices can be realized by wiring or by printing an insulator in a proper pattern and electrochemically depositing a metal layer using an ionic liquid.

In a further embodiment according to the invention, prior to the applying of the electrically conductive material interconnecting the separated OLED-devices an insulating material is at least partially applied. This may further improve the method by avoiding short circuits.

In a variation of the method, the organic optoelectronic active material may be applied by a printing process, e.g. by use of printing solution process able functional materials. The method according to the invention is applicable in the production process of different kinds of OLED-devices, like e.g. inverted OLED-devices in which the top electrode is the anode, or top emitting or transparent OLED-devices in which the top electrode and/or the bottom electrode is transparent. For the latter, a TCO may be used as electrode material.

In a further variation of the method, the ablation is done from the substrate side.

One of the advantages of the proposed method beside cost savings is the possibility to create small feature sizes as only the printing accuracy limits the minimum spacing of the OLED-devices. In addition, all arrangements of OLED arrays can be realized with hardly no limitation to the shape of the OLED.

In a further aspect, the invention relates to an illuminant comprising at least two serial connected OLED-devices, wherein each the OLED-device comprises at least a first electrode material layer, an optoelectronic active material layer and a second electrode material layer, wherein the at least two OLED-devices are formed on a common carrier substrate in a pattern having a pattern size of less than 200 μm. Such illuminate can be produced by using the inventive method as described above. The pattern size of less than 200 μm enables to form an illuminant based on OLED-devices having an advantageously high resolution.

In an embodiment of an illuminant according to the invention, the OLED-devices are separated by a trench and the first electrode material layer of a first OLED-device is connected to the second electrode material layer of a second OLED-device by a conductive material filling at least partially the trench. Filling at least partially the trench should be understood as that the conductive material fills the trench over its whole vertical cross-section, while it does not fill the trench over its whole horizontal cross-section. In other words, only one side of the trench is filled by the conductive material.

In a further embodiment of the illuminant according to the invention, the conductive material is a paste which can be annealed. This advantageously makes partially filling of the trench easier. The conductive material preferably is selected from the group consisting of metal pastes, conductive polymers and conductive glues. Furthermore, the conductive material can preferably be annealed by thermal and/or UV-exposure.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1A:
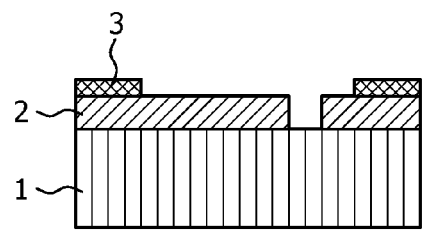
FIG. 1 shows a process scheme for the production of OLEDs according to the state of the art.
Figure 1B:
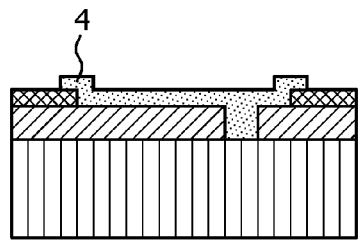
Figure 1C:
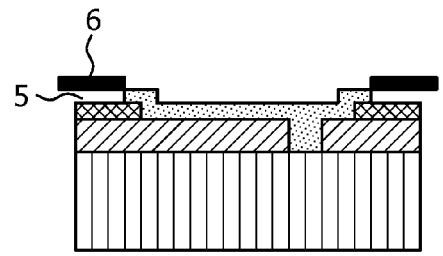
Figure 1D:
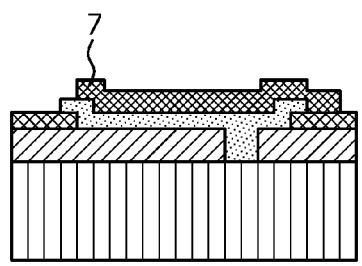
Figure 1E:
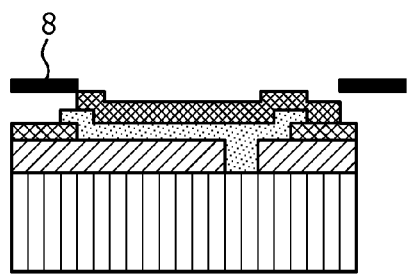
Figure 1F:
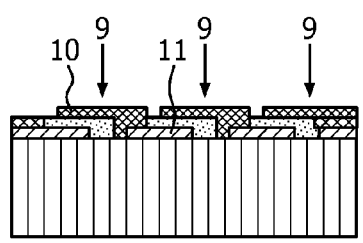

In FIG. 1, a scheme of a process for the production of OLEDs according to the state of the art is shown. In step 1 A, on a carrier substrate 1 a transparent conductor layer 2 is deposited in specific pattern defining the later OLED-device structure. The patterning can be done by masking the areas not to be covered by the deposit, like e.g. by sputtering through a shadow mask or printing methods. The transparent conductor may be ZnO, an ITO, and/or a PEDOT/PSS-layer. On this transparent conductor layer 2 optional metal lines 3 are deposited. The pattern structure is filled in step 1 B with an optoelectronic active material 4. Small molecule optoelectronic active materials commonly are deposited by thermal evaporation in vacuum. The deposition of the organic material must be restricted in such a way that at least the cathode contacts 5 are not coated. Usually, also the anode contacts are protected from the coating in order to achieve good electrical contacting later on. As visible in step 1 C, this structured deposition is achieved by means of shadow masks 6. These masks 6 are specific for each OLED design and are placed on top of the substrate during organic optoelectronic active material deposition. In step 1 D, a cathode layer 7 is deposited. This also happens in a vacuum thermal evaporation process. The layer 7 must be structured, too, as otherwise a short circuit between the cathode layer 7 and the anode layer 2 will occur. Therefore, in cathode deposition a shadow mask 8 is used to protect areas in the device from deposition as depict in step 1 E. Also here, the mask 8 will be coated with material, wherein the cathode material typically is a metal like copper, silver, aluminum, gold, etc. As can be seen in step 1 F, when a serial connection of individual OLED segments 9 needs to be realized, a very complicated set of shadow masks is required as the anode 10 of one pixel needs to be connected with the cathode 11 of the next pixel.

Figure 2A:
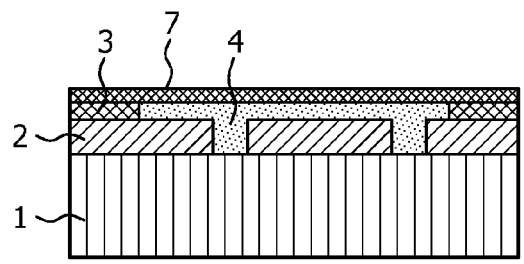
FIG. 2 shows a process scheme according to an aspect of the invention.
Figure 2B:
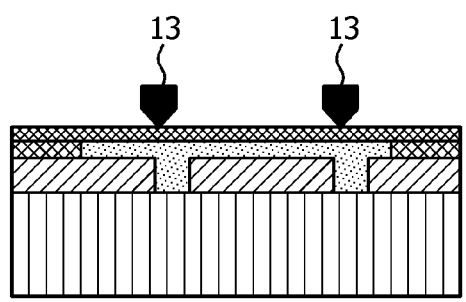
Figure 2C:
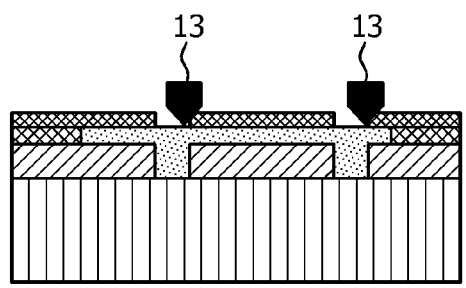
Figure 2D:
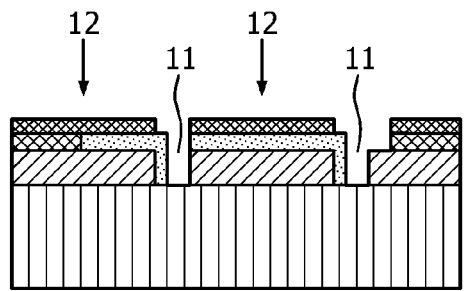
Figure 2E:
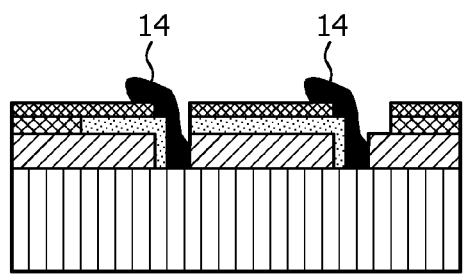

In FIG. 2, a process scheme according to an aspect of the invention is shown. In step 2 A, on a carrier substrate 1 a conductor layer 2 is deposited in pattern. On this conductor layer 2 an organic optoelectronic active material is deposited over the whole area without using any masking techniques. On this organic optoelectronic active material layer 4 a second electrode material layer is deposited which will form a cathode layer 7 of the OLED-device later on. While the step 2 A may be performed in a vacuum chamber to avoid impurities, steps 2 B to 2 D can be performed outside a vacuum chamber. In the steps 2 B to 2 D, the laminar OLED-structure is divided in separated OLED-devices by at least partial ablation of the layers 4 and/or 7. Ablation can be performed by a laser beam 13. By the ablation trenches 11 are formed, separating the neighboring OLED-devices 12. In a derivation of the inventive method not shown, also layer 2 is deposited in a non-pattern way and the structuring of the conductor material layer 2 is performed by ablative methods, too. In step 2 E, the trenches 11 are at least partially filled with a conductive material 14, which material 13 electrically interconnects layer 1 of a first OLED-device to layer 3 of a neighboring second OLED-device. The conductive material 14 may be a paste. These paste is printed onto the cathode layer 3 extending into the trench 11 between the individual OLED-devices. After deposition an annealing step is applied in order to achieve better conductivity. This can also be done using a laser system and thus only heating the OLED-device locally and therefore avoiding damage to the structure by excessive heat dissipation.

By the method described before, an illuminant can be provided which comprises at least two serial connected OLED-devices (12, 15), wherein each the OLED-device (12, 15) comprises at least a first electrode material layer (2), an optoelectronic active material (4) layer and a second electrode material layer (7), wherein the at least two OLED-devices (12, 15) are formed on a common carrier substrate (1) in a pattern having a pattern size of less than 200 μm. The OLED-devices (12, 15) are separated by a trench (11) and the first electrode material layer (2) of a first OLED-device (12) is connected to the second electrode material layer (7) of a second OLED-device (15) by a conductive material (14) filling at least partially the trench (11). the conductive material (14) is a paste which can be annealed, preferably selected from the group consisting of metal pastes, conductive polymers and conductive glues, which conductive material can be annealed by thermal and/or UV-exposure.

The invention claimed is:

1. An illuminant comprising at least two serially and electrically connected OLED-devices, wherein each the OLED-devices comprises at least a first electrode material layer, an optoelectronic active material layer and a second electrode material layer, wherein the at least two OLED-devices are formed on a common carrier substrate in a pattern having a pattern size of less than 200 μm and wherein, in a first OLED-device of said at least two OLED-devices, the second electrode material layer is disposed above said optoelectronic active material layer, the optoelectronic active material layer is disposed above said carrier substrate and above said first electrode material layer, and a portion of said optoelectronic active material layer extends horizontally beyond an edge of said second electrode material layer.

2. An illuminant according to claim 1, wherein the at least two OLED-devices are separated by a trench and the first electrode material layer of a first OLED-device of the at least two OLED-devices is connected to the second electrode material layer of a second OLED-device of the at least two OLED-devices by a conductive material filling at least partially the trench.

3. The illuminant according to claim 2, wherein the conductive material is a paste which can be annealed.

4. An illuminant according to claim 3, wherein the conductive material can be annealed by thermal and/or UV-exposure.

5. An illuminant according to claim 2 wherein the conductive material is selected from the group consisting of metal pastes, conductive polymers and conductive glues.

6. The illuminant according to claim 1, wherein the first electrode material layer of a second OLED-device of the at least two OLED-devices is connected to the second electrode material layer of the first OLED-device by a conductive material, wherein at least a portion of the conductive material is in contact with a top of said portion of said optoelectronic active material layer of said first OLED-device.

* * * * *